US010068782B2

(12) United States Patent
Teshima et al.

(10) Patent No.: US 10,068,782 B2
(45) Date of Patent: Sep. 4, 2018

(54) DEVICE AND METHOD FOR SCRIBING A BOTTOM-SIDE OF A SUBSTRATE WHILE VIEWING THE TOP SIDE

(71) Applicant: LatticeGear, LLC, Beaverton, OR (US)

(72) Inventors: Janet Teshima, Portland, OR (US); Efrat Moyal, Los Gatos, CA (US)

(73) Assignee: LatticeGear, LLC, Beaverton, OR (US)

( * ) Notice: Subject to any disclaimer, the term of this patent is extended or adjusted under 35 U.S.C. 154(b) by 167 days.

(21) Appl. No.: 15/191,293

(22) Filed: Jun. 23, 2016

(65) Prior Publication Data

US 2016/0379849 A1 Dec. 29, 2016

Related U.S. Application Data

(60) Provisional application No. 62/183,674, filed on Jun. 23, 2015.

(51) Int. Cl.
  *H01L 21/78* (2006.01)
  *H01L 21/67* (2006.01)
  *B28D 5/00* (2006.01)
  *B25H 7/04* (2006.01)

(52) U.S. Cl.
  CPC ......... *H01L 21/67092* (2013.01); *B25H 7/04* (2013.01); *B28D 5/0011* (2013.01); *H01L 21/78* (2013.01)

(58) Field of Classification Search
  CPC . H01L 21/67092; H01L 21/78; B28D 5/0011; B25H 7/04
  USPC ....................................... 33/18.1, 32.5, 32.6
  See application file for complete search history.

(56) References Cited

U.S. PATENT DOCUMENTS

| 2,403,633 | A | * | 7/1946 | Browning | ................ | B25H 7/00 |
| | | | | | | 33/18.1 |
| 2,913,963 | A | * | 11/1959 | De Boer | ................ | B23Q 35/10 |
| | | | | | | 33/18.1 |
| 4,046,985 | A | * | 9/1977 | Gates | ........................ | G03F 9/70 |
| | | | | | | 219/121.68 |

(Continued)

OTHER PUBLICATIONS

Opto Phase, "Diamond Scriber;" Company web site; Copyright 2006-2015.

(Continued)

*Primary Examiner* — Christopher Fulton
(74) *Attorney, Agent, or Firm* — Ater Wynne LLP

(57) ABSTRACT

A device includes a table surface defining a horizontal plane having an x-axis and a y-axis orthogonal to the x-axis and the x-axis and y-axis lie in the horizontal plane; a scribe mounted below the horizontal plane, the scribe further disposed to present at least a portion of the tip above the horizontal plane; a rail arranges parallel to the y-axis and movable in a direction parallel to the x-axis; a sample guide configured in relation to the horizontal plane so that the sample guide arranges parallel to the x-axis and movable in a direction parallel to the y-axis; a scribe stop guide configured in relation to the horizontal plane so that the scribe guide arranges parallel to the x-axis and movable in a direction parallel to the y-axis, whereby the sample guide moves independent of the scribe stop, the scribe stop further comprising a locking mechanism.

20 Claims, 7 Drawing Sheets

Device for Scribing a Bottom Side of a Substrate with Reference to a Top Side Feature
100

(56) References Cited

U.S. PATENT DOCUMENTS

| | | | | |
|---|---|---|---|---|
| 4,137,803 A * | 2/1979 | Goldinger | | C03B 33/10 |
| | | | | 33/32.6 |
| 5,785,225 A | 7/1998 | Loomis | | |
| 6,513,694 B1 | 2/2003 | Xu et al. | | |
| 6,826,840 B1 * | 12/2004 | Lindsey | | H01L 21/67092 |
| | | | | 33/18.1 |
| 7,263,777 B2 * | 9/2007 | Adams | | G01N 3/46 |
| | | | | 33/32.6 |
| 7,858,493 B2 | 12/2010 | Sun et al. | | |
| 8,871,612 B2 | 10/2014 | Han et al. | | |
| 2001/0027986 A1 | 10/2001 | Dautartas et al. | | |
| 2001/0055856 A1 * | 12/2001 | Tao | | H01L 21/78 |
| | | | | 438/462 |
| 2007/0180715 A1 * | 8/2007 | Nishio | | B28D 1/225 |
| | | | | 33/18.1 |
| 2008/0263877 A1 * | 10/2008 | Maneuf | | B23K 26/06 |
| | | | | 33/32.5 |
| 2009/0230102 A1 * | 9/2009 | Soyama | | B28D 1/221 |
| | | | | 219/121.69 |
| 2011/0283552 A1 * | 11/2011 | Soyama | | B28D 5/0011 |
| | | | | 33/18.1 |
| 2013/0119106 A1 | 5/2013 | Moyal | | |
| 2013/0276610 A1 * | 10/2013 | Bando | | B28D 5/0011 |
| | | | | 83/880 |
| 2016/0151929 A1 * | 6/2016 | Ogushi | | B26F 3/002 |
| | | | | 225/2 |

OTHER PUBLICATIONS

Initemp, "Precision Diamond Scriber for Manual Wafer Scribing;" Company web site; Copyright 2007-2016.
Terra Universal, "Adjustable Diamond Scriber," Company web site.
Owens Design, "Case Studies: Semiconductor;" Company web site; Copyright 2011.
NPOS Technologies, Inc.; "Dry Process Dicing," Company website; Copyright 2013.

* cited by examiner

Device for Scribing a Bottom Side of a Substrate with Reference to a Top Side Feature
100

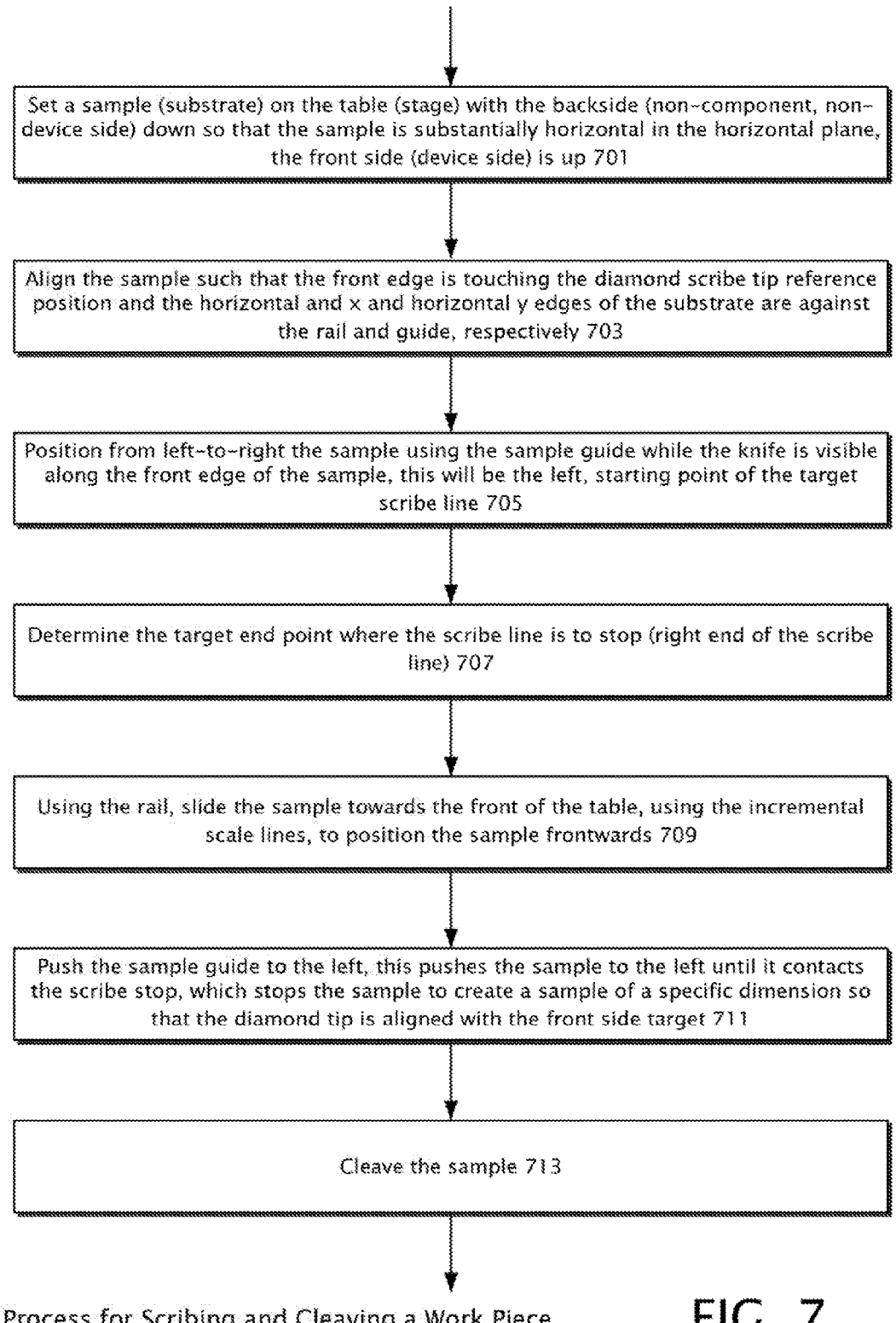

DEVICE AND METHOD FOR SCRIBING A BOTTOM-SIDE OF A SUBSTRATE WHILE VIEWING THE TOP SIDE

CROSS-REFERENCE TO RELATED APPLICATION

This application claims the benefit of U.S. Provisional Patent Application No. 62/183,674 filed Jun. 23, 2016, the contents of which are hereby incorporated by reference.

TECHNICAL FIELD

This description relates generally to a substrate scribing method and apparatus by which a substrate is scribed and subsequently cleaved along scribing marks, and more specifically to a method and device for scribing a substrate on the underside of the substrate while viewing the opposite (top) side without contacting the device (top) side in preparation for cleaving.

BACKGROUND

In semiconductor fabrication multiple die or circuits are fabricated on a single substrate. As part of the manufacturing process of integrated circuits the die are separated and individually packaged. Commonly, substrates are cut by means of a scribing tool that indents the device side. Die may also be separated by cutting took as well.

Also, the die may be separated in a production environment, or in a laboratory environment. In a laboratory environment the circuits are typically designed and tested, or may be tested as part of a production sampling and testing program. It is typically advantageous to separate the die for individual testing or packaging or to sub-sample the die to verify critical dimensions and metallurgy. In production, such separation may be achieved by utilizing complex high rate equipment that may utilize machine vision, precision alignment, vacuum hold downs, and the like to process a large number of cuts at a high rate. While accurate and fast, such equipment may not be practical due to its expense and complexity in a small production facility or laboratory environment where the design and testing of integrated circuits may be performed.

Typically, in such laboratory, or development and testing environments, scribing of a substrate may be done by scribing the top, along the length of the wafer to downsize the wafer for subsequent testing or analysis. A ruler or guide may be placed on top of the integrated circuit to guide the scribing of the top surface. Such practices can tend to damage the integrated circuit. If the top of the integrated circuit has not had a final stage glass passivation layer disposed on it, or other final processing, the wafer surface is particularly susceptible to damage. This is especially the case of wafers that are removed from the process stream for testing prior to the final stages of processing.

Such a guide may be placed with the aid of magnification to align the scribe and subsequent fracture between die. However, if the scribe line is still positioned via straight edge the circuit may be damaged. If it is attempted to scribe the back to avoid damaging die by the cleaving process, no amount of front side magnification will help align the scribe mark relative to the front side features to accurately cleave between the die, since the operator would essentially be working blind in placing the back surface scribe.

Accordingly, there is a need for a device that accurately scribes the back of the wafer with reference to top side features, to avoid damaging features on the top by ruler placement and scribing on the top. However as mentioned, if scribing is performed on the back of the work piece, it may be difficult to place the scribe line (and ultimately perform the cleaving) in reference to the circuit features on the top of the wafer so such features are not cut into, or otherwise damaged by an inaccurate separation if such a scribed line is made on the back of the wafer it is typically difficult to position such a scribe line so that features on the top of the wafer are not cut into.

Accordingly, it may also, be advantageous to provide a device that aids in positioning and scribing the back side of a wafer, while also providing structure aiding aligning such a back side scribing relative to features on the wafer top surface.

Further yet, there is a need for such a device and method to include enabling the operator to observe, by naked eye or by magnification (i.e. stereoscope) the device side while making the back sided scribe and subsequent cleaving of the substrate to further improve accuracy.

Thus, there is a need in the art an improved tool and method for scribing substrates (both crystalline and amorphous) without contacting the device side, while enabling the operator to reference the device side, and further to enable scribing the back side with scribe lines using references or a scale or both, relative to the device side—and to make such lines without powered cutting tools, and other unneeded and costly complexities.

SUMMARY

The following presents a simplified summary of the disclosure in order to provide a basic understanding to the reader. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

The present example provides a device and method for scribing a bottom side of a substrate or work piece that positions the scribe relative to a feature on the opposite, top side of the substrate. The device and methods allow for scribing of crystalline and amorphous materials. The device provides visual references and mechanical aids to guide scribing. Mechanical aids include reference marks on table, a guide to aid in positioning the substrate, a second guide orthogonal to the first, and a mechanical stop, which may be mechanically adjustable to set the scribe length. In an alternative example, an adapter may be included to aid in scribing round or substantially round substrates. In a further alternative example a magnification device may be added to aid in the alignment and scribing process.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein:

FIG. 7 is a flow diagram showing a process for scribing and cleaving a work piece.

Like reference numerals are used to designate like parts in the accompanying drawings.

DETAILED DESCRIPTION

Figure 1:
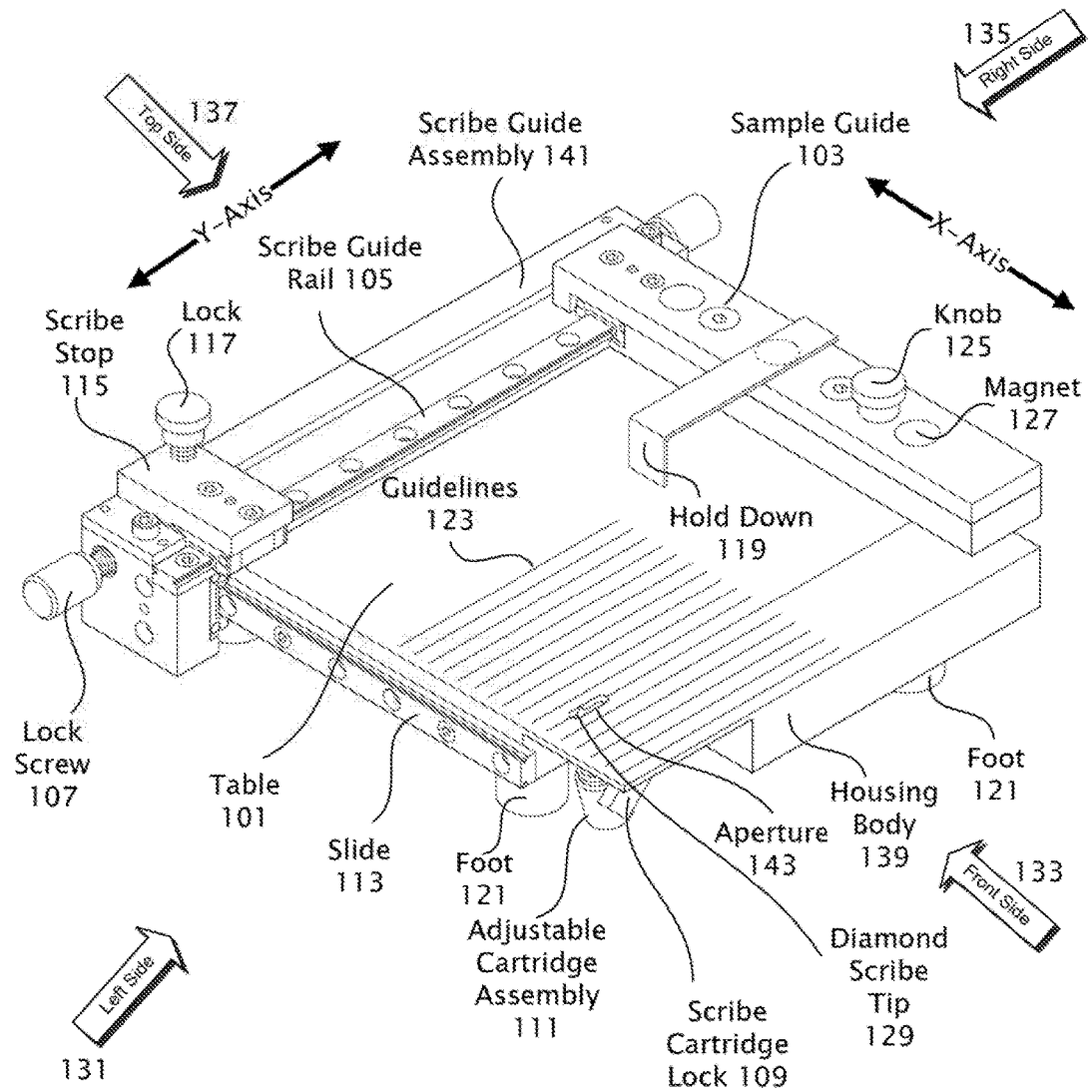
FIG. 1 is an elevated front perspective view of a first example of the device for scribing a bottom side of a substrate with reference to a top side feature.

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

The examples below describe a device for scribing a bottom side of a substrate, with reference to a top side feature such as used in semiconductor fabrication or similar applications where substrates need to be downsized for further processing or quality control, with reference to a top side feature, without contacting the top side feature (which may be fragile) during the process of aligning, scribing and subsequent cleaving. Exemplary applications may include sampling specific circuitry within the die, in particular cleaving specific targets to verify the material stack composition and metrology. In-production sampling may be made at some given number of wafers that may be removed from fabrication and taken into the lab for sampling. Although the present examples are described and illustrated herein as being implemented in a semiconductor processing system as a work piece, the system described is provided as an example and not a limitation. As those skilled in the art will appreciate, the present examples are suitable for application in a variety of different types of sample preparation systems including those for processing crystalline and amorphous materials, and in general, any thin wafer like material where scribing on a back side relative to a feature on a parallel front side is desired without contacting the front side.

In the following description it is to be noted that partial scribing along the subsequent break is only possible on crystalline material, such as mono crystalline silicon wafers, or the like. On a crystalline material a short scribe mark is only needed to initiate a linear cleave along the length of the scribed material. For amorphous materials scribing the entire length of the substrate is typically performed to enable accurate breaking/cutting of amorphous materials such as glass or other substrates such as sapphire or the like where it is often desirable to create a break not defined along the crystal plane. The tool described herein is suitable for use on both crystalline and amorphous substrates.

The various examples of the present invention provide manual low cost, high quality, and high accuracy scribing of a substrate on the bottom (non-device) side of the substrate while using references observed either by the naked eye or by magnification, or both, including using a scale or other measured increments based off the top (device) side of the substrate. The present examples provide a simplified, accurate and efficient mechanical tool and method that enables an operator to accurately, precisely, and reliably scribe and cleave a substrate without contacting the device side—yet still allow the operator to view and reference the device side. This is important to prevent damaging the device side and to ensure a precisely located scribe line and accurately positioned cleave. These features enable accurate positioning of the scribe line on the back as made while looking at the front side of the sample.

Other features of the device for scribing a bottom side of a substrate with reference to a top side feature include it being a simple mechanical tool with no electrical components. The cutting tool includes a scribing table with fence and diamond scribe tip. The diamond scribe angle and height are adjustable. Further elements include rails and linear guides to keep the cuts/scribes orthogonal. The scribe length can be selectively determined and can vary in length. And, sample size can also be measured using ruler or guidelines embedded in the table.

Further, the various examples of a device for scribing a bottom side of a substrate with reference to a top side feature described herein tend to provide a low cost, high quality, high accuracy cleaving device and method suitable for mono-crystalline material and other brittle substrates. The device and method of the present invention provide successful cleaving through a target even with minimal experience and expertise and doesn't rely on human capabilities, such as hand and eye coordination based on skill or extensive training.

The device for scribing a bottom side of a substrate with reference to a top side feature may be considered well-adapted for use in site specific, cross-sectional examination, with an accuracy of a hundred microns of the area of interest. The present invention works well with various samples including front-end, back-end TSVs, single die, and glass substrates for example. Another well-suited use includes a bulk removal step prior to FIB "focused ion beam" sample preparation.

The device for scribing a bottom side of a substrate with reference to a top side feature has accuracy on the order of 100 microns. The device can be used to reduce large substrate pieces to small samples suitable for further preparation in ion beam, electron beam instruments or further processing. Yet another exemplary use for the device for scribing a bottom side of a substrate with reference to a top side feature includes quality analysis of wafers where a quality analysis of wafer sample cross-section is desired. Another use for the device for scribing a bottom side of a substrate with reference to a top side feature includes sample preparation for failure analysis, process monitoring and product development. In the examples shown, the device for scribing a bottom side of a substrate with reference to a top side feature mechanizes and systemizes the typically manual performed scribe and cleave process practiced daily in laboratories that tend to be inaccurate and subject the circuits to damage.

Figure 2:
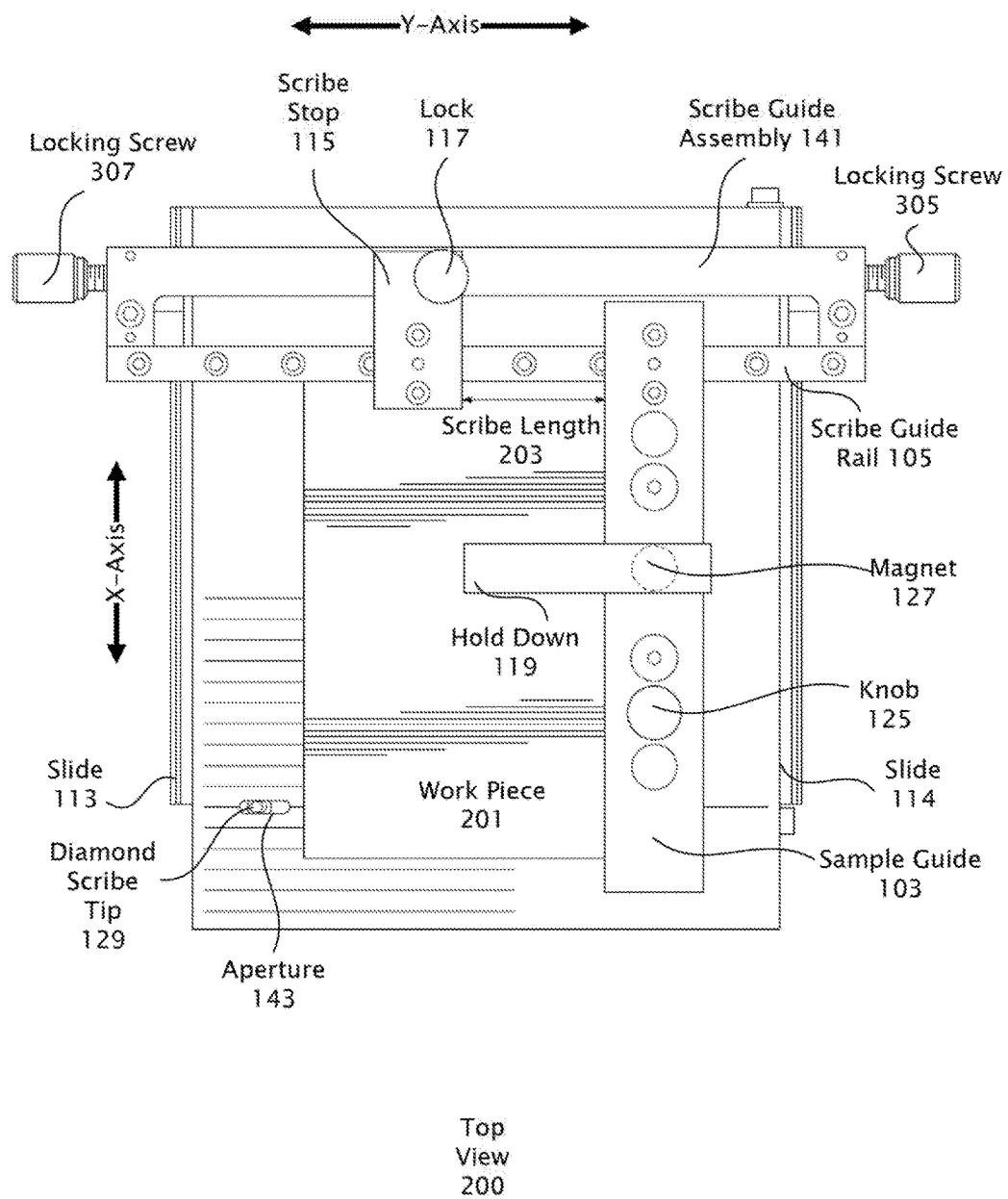
FIG. 2 is a top view of the example of FIG. 1 showing a rectangular or square work piece in place prior to scribing.
Figure 3:
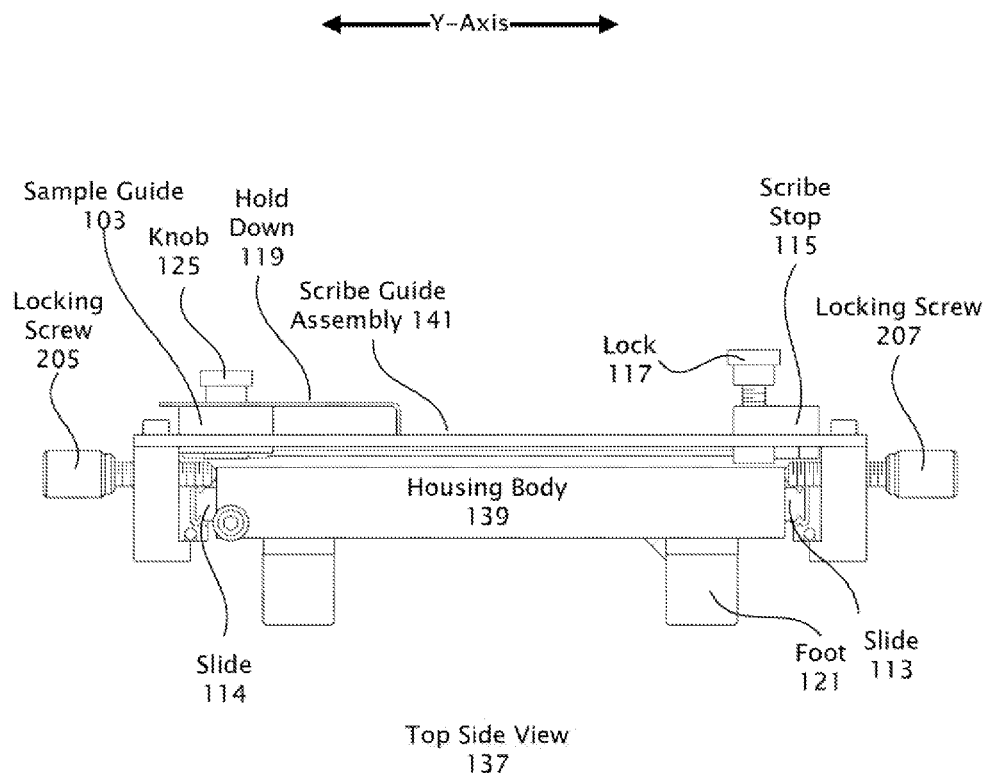
FIG. 3 is a top side view of the example of FIG. 1.
Figure 4:
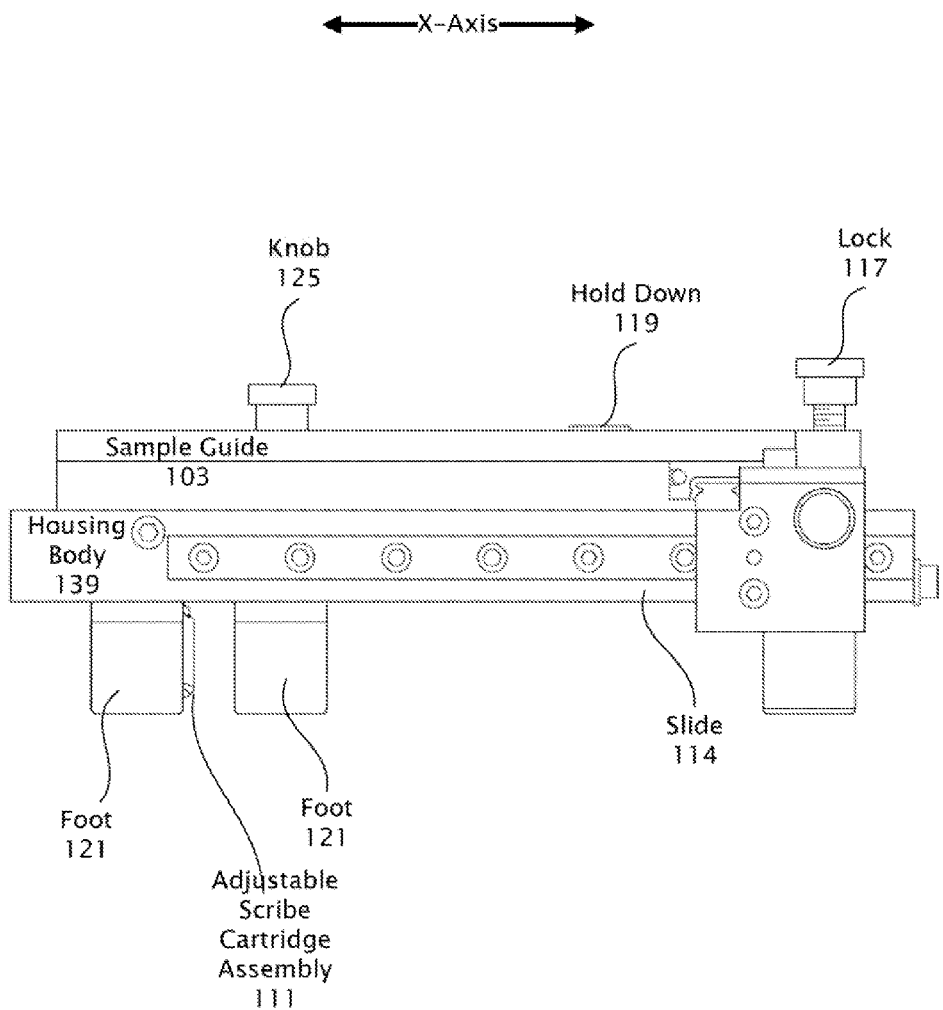
FIG. 4 is a left (right) side view of the example of FIG. 1.
Figure 5:
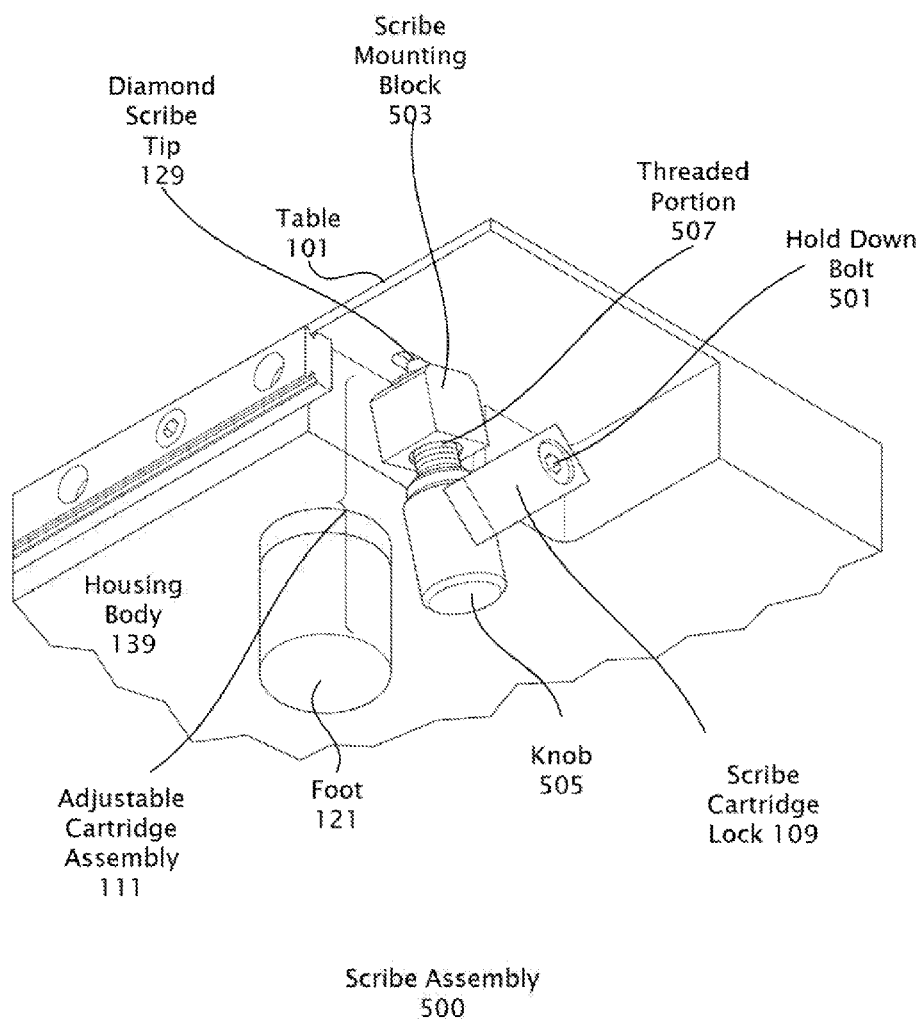
FIG. 5 shows details of scribe mounting as viewed from the bottom of the example of FIG. 1.

FIG. 1 is an elevated front perspective view of a first example of the device for scribing a bottom side of a substrate with reference to a top side feature. FIGS. 2-4 show the example of FIG. 1 in various orthographic views. FIG. 5 shows details of the scribe mounting and adjustment mechanism as viewed from underneath the device. The following description of the first example of the device for scribing a bottom side of a substrate with reference to a top side feature will reference FIGS. 1-5 utilizing common reference numbering for common features throughout.

The device for scribing a bottom side of a substrate with reference to a top side feature 100 includes a table or stage 101 for supporting a work piece, or equivalently a substrate (201 of FIG. 2, for Example), a diamond scribe tip 129 arranged to scribe the bottom (non-device) side of a substrate using visual references or guidelines 123 to the top, device side of the work piece, but without contacting the top, device side of the work piece during the operation since such lines may be disposed on the table 101 facing the bottom surface of the work piece.

The table 101 is the platform, or surface, upon which a work piece rests, and is a planar outer surface of the housing body 139. The table 101 may be generally rectangular or square to facilitate the use of rectangular coordinates in locating and scribing on a work piece, as such a work piece (as shown at 201 in FIG. 2 for example) typically mirrors such rectangular coordinates in the disposition of features on the work piece. The table 101 and housing body 139 may be constructed from metal or any other suitable material. Equivalently they may be made from a single piece or from several components that are assembled together. On a housing surface opposite to the table 101, three or more rubber feet 121, or equivalent may be disposed, to keep the device 100 from slipping about during use. Also, on the reverse side a let out area may be provided for mounting the scribe, with the diamond tribe tip 129 protruding through an aperture in the table 101. The sides of the housing body 139 provide sufficient surface and otherwise facilitate the mounting and operation of movable guides 103, 141 that operate in right angle, or orthogonal relation to each other.

The device includes guidelines 123 disposed on the table. The guidelines, aid in positioning the diamond scribe tip 129 in relation to the top surface features of a work piece to be placed on the table 101. Table 101 may include guidelines or reference marks 123 corresponding to a desired scale, such as exemplary lines arranged parallel to the y-axis in the horizontal plane. Exemplary divisions may include major markings spaced 5-mm apart, and minor lines also parallel to the y-axis spaced at 1-mm increments. In alternative examples, lines parallel to the x-axis may also be provided, or equivalently any other suitable pattern to aid alignment may be disposed on the table 101 may be utilized. In further alternative examples an interchangeable overlay with guidelines may be provided. The scale 123 enables an operator to make a more repeatable visual positioning of a work piece 201 on the table 101 and assists in placing the scribe line on the sample.

The scribe guide assembly 141 and its associated scribe guide rail 105 is coupled to the sample guide 103 so that the sample guide moves with the .scribe guide assembly 141 as it is positioned either up or down from an initial position. The scribe guide assembly 141 moves along the x-axis, or up and down as referenced to a typical operator using the device. The scribe guide assembly 141 may include a locking mechanism that may include one or more set screws 107, or an equivalent mechanism, so the rail can be selectively secured in a desired position along the x-axis in the horizontal plane, this guide further includes a scribe guide rail 105 configured to engage, contact, or otherwise touch a work piece that may be placed on the table 101 against it acting as a guide, thus restricting x-axis movement of the sample and positioning the sample with respect to the diamond scribe tip 129 in the x-axis direction. The scribe guide assembly 141 may be coupled to the housing body 139 through a slide mechanism 113 or its equivalent. The scribe guide assembly 141 also supports the scribe stop 115 slidably coupled to it.

The scribe stop 115 slides along the length of the slide guide assembly 141. The scribe length is selectively determined using the scribe stop 115. The scribe stop 115 further includes a set-screw or locking screw 107 that selectively locks the scribe stop 115 into a desired position.

The sample guide 103 moves freely back and forth along the Y-axis, or from left to right as a typical operator would use the device 100. The sample guide 103 is slidably and orthogonally coupled to the scribe guide assembly 141 at a first sample guide end. At a second slide guide end of the sample guide 103 a roller, ball bearing or equivalent may be provided (not shown) to allow a cantilevered end of the sample guide to roll freely over the table 101. One or more magnets 127 may be disposed in the sample guide 103, to couple to a ferromagnetic hold down 119 that optionally may be positioned as desired to hold down a work piece as it is scribed. In equivalent examples other hold down mechanisms as known to those skilled in the art may be substituted for the one shown.

The scribe assembly 500 is disposed on an underside of the table 101, with the diamond scribe tip 129 of the scribe assembly 500 protruding through a suitable aperture 143 disposed in the table 101. The diamond scribe tip is used to scribe the back side, and subsequently cleave a work piece positioned in the apparatus 100 and oriented relative to a top side feature, so that the top side feature is not contacted or otherwise damaged by the scribing and cleaving process.

FIG. 2 is a top view of the example of FIG. 1 showing a rectangular or square work piece 201 in place prior to scribing. A work piece, or equivalently a substrate or wafer 201 of a rectangular or square shape may be placed on the table 101. Orthogonal guides 105, 103 may be positioned to control and guide the work piece 201 as it is scribed with diamond scribe tip 129. Before the guides 103, 141 are set, guidelines 123 may be used to help line up the work piece 201 on the table 101 for scribing and subsequent cleaving. In addition, a mat (not shown) having a grid disposed on it may also be used for alignment by laying the work piece 201 on it, circuit side up, and making note of (for example by marking) desired cleaving positions to be transferred to the device in scribing a bottom side of a substrate with reference to a top side feature. With the work piece 201 positioned as desired in relation to a surface feature, and against the diamond scribe tip 129, guides 141 and 104 may be positioned to accurately scribe the work piece 201. The sample guide 103 may be lined up against an edge of the work piece 201, and as the sample guide 103 travels freely along and perpendicular to the Y-axis just over the table surface or sliding over it, the sample guide 103 may be used to push the work piece 201 over a diamond scribe tip 129 scoring the work piece 201. For further accuracy an orthogonally positioned guide-the sample guide assembly 141, may also be put into position before scribing the work piece 201.

To set the vertical position of the scribe, the scribe guide assembly 141 may be released and brought down against a top edge of the work piece 201, so that the scribe guide rail 105 may rest against and guide the work piece 201, as it slides from right to left against it and as it is being pushed by the sample guide 103, over the diamond scribe tip 129.

Positioning and hold down of the work piece 201 may be aided by a ferromagnetic hold down 119, a holder that may be magnetically held in place by at least one of a plurality of magnets 127 disposed in the sample guide 103.

The device may also control the length of the linear scribe mark. A scribe stop 115 is provided to accomplish this. The diamond scribe tip 129 typically produces a linear scribe mark across a portion of the cork piece (for crystalline materials), or across the entire length of the work piece (for amorphous materials). The horizontal length of the scribe may be set by adjusting a first edge of the work piece 201 against the diamond scribe tip 129, with the sample guide 103 set against the second opposite parallel edge of the work piece 201. The scribe stop 115 may then be unlocked by releasing locking knob 117, and positioning it a distance to be equal to the desired scribe length away from the sample guide 103. The gap between the sample guide and the scribe stop is the length of the scribe mark. When so positioned, the work piece 201 may be pushed across the diamond scribe tip 129, by the sample guide 103 until the stop 115 is encountered by the sample guide 103. The scribe guide assembly 141 helps maintain vertical alignment of the work piece 201 during the scribing operation.

To support the above described mechanisms 103, 141, 129 the device for scribing a bottom side of a substrate with reference to a top side feature 100 may include a table (or stage) 101 disposed on a housing body 139. The housing body 139 and table 101 having a substantially flat top, an adjustable scribe cartridge assembly 111, at least one reference mark, or guideline 123 disposed on the table 101, a movable rail 105 arranged in the horizontal plane, parallel to a y-axis and being movable along the x-axis, and a sample guide 103 arranged parallel to the x-axis and disposed in the same horizontal plane as the rail and movable along the y-axis and a scribe stop 115, also arranged in the common horizontal plane, the scribe stop 115 moves along the y-axis. The scribe stop 115 and the sample guide 103 move independent of each other and can be moved toward each other or away, so to control the length of the scribe.

FIG. 3 is a top side view of the example of FIG. 1. This figure shows further details not seen in the perspective view, including interaction of the locking screws 205, 207 and, the slides 113, 114.

FIG. 4 is a left (right) side view of the example of FIG. 1. This figure shows further details not seen in the perspective view, including the parallel slide 114 (parallel to slide 113 of FIG. 1).

FIG. 5 shows details of scribe assembly 500 as viewed from the bottom of the example of FIG. 1 The diamond scribe tip 129, also referred to as diamond scribe or diamond tip, includes an adjustment mechanism for height (distance the tip extends above the surface of the table) and angle relative to the horizontal plane. The diamond scribe tip is diamond in this example. However, any material with sufficient hardness such as tungsten, carbide, or the like could be equivalently substituted for a scribe tip. During the scribing operation the scribe is fixed with respect to height above the table 101 and tilt of the diamond scribe tip 129, the sample is pushed over the scribe 129 using the rails (105 and 103 of FIG. 1) for alignment. The adjustable scribe cartridge assembly 111 may include a diamond scribe tip 129 having an exemplary diamond tip at a first end with a knob 505 at a second end, and a threaded portion 507 there between. The threaded portion 507 may be coupled to a scribe mounting block 503 via threaded engagement of the two pieces. Height of the diamond scribe tip 129 above the table 101 may be controlled by turning the knob 505. The height and angle of the diamond scribe tip 129—in particular angle or tilt—may be controlled by pushing the entire adjustable knife holder (111) left to right in the y-axis, The scribe mounting block may include an integral stud (not shown) threadably coupled to the housing body 139, so that the block 503 may be twisted from side to side to vary the diamond scribe tip 129 angle. Any given setting may be secured by the scribe cartridge lock 109, with a holding force being applied by hold down bolt 501.

Alignment accuracy in the device 100 can be further improved by adding optical magnification. Based on the size of the target and the application required, the device can be used with the naked eye, placed under optical microscope or coupled up with magnification devices including cameral kits using a vertical mounting pole arranged perpendicular to table, conventional tools including kits, pliers, and scribes; and an optical microscope which will improve the cleaniness and accuracy of the cleave. For example, compressed air is used to remove dust from the stage by manually using a nozzle to dust off the stage, and suction devices can be incorporated for aiding in the removal of the cut sample from the table (101).

The entire device, in yet another contemplated embodiment, is placed under an optical microscope with long working distance optics. Another option would be to use a compact digital camera or other magnifying optics.

Figure 6:
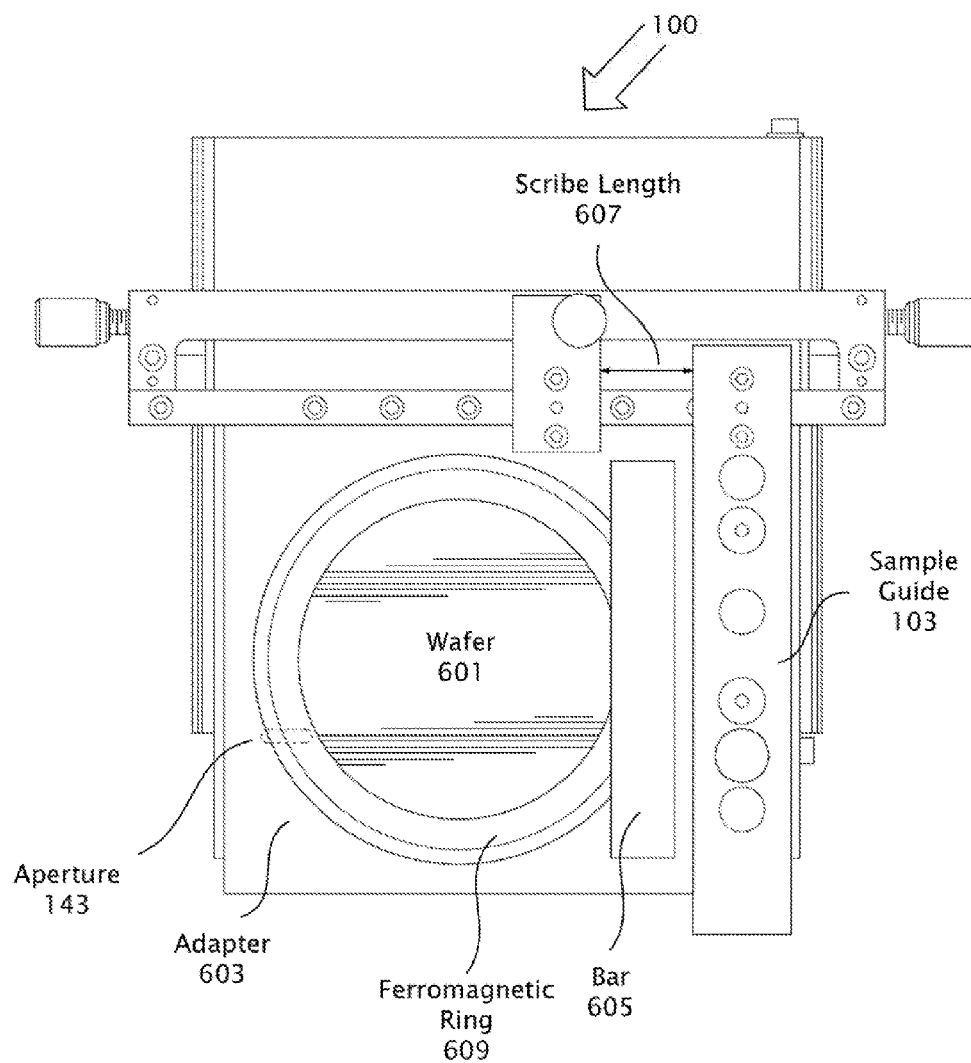
FIG. 6 is a top view of the example of FIG. 1 showing an alternative example having a circular work piece disposed in a carrier in place prior to scribing.

FIG. 6 is a top view of the example of FIG. 1 showing an alternative example having a circular work piece 601 disposed in an adapter 603 in place prior to scribing. Here the work piece is shown in position with the place where it is determined to place the scribe the wafer 601 being determined as shown in the diagram by the aperture 143. The scribe length has been set 607, and movement of the sample guide 103 to the left will scribe the wafer for the set scribe length 607.

The adapter 603 is configured with a circular aperture substantially matching the diameter of the silicon wafer 601. The wafer may rest on a ledge disposed in the adapter 603 about its circumference. The adapter may also include a ferromagnetic ring 609 disposed about its circumference. Since silicon and other wafers types typically include a flat side, a bar 605 may be included to fill the adapter circular aperture and hold the wafer in place, and otherwise aid in orienting the wafer 601 in the device 100. The bar 605 typically rests on top of the adapter 603, and may be magnetically coupled to a ferromagnetic ring 609 disposed about the circumference, with a protrusion from the bar on a side opposite to the one shown filling the gap and locking the wafer in position. Typically, magnets would be included in the bar for coupling to the ring 609.

FIG. 7 is flow diagram showing a process for scribing and cleaving a work piece. One preferred method of the present invention includes the following steps, and the method uses the device 100 as described above:

Set a sample (substrate) on the table (stage) with the backside (non-component, non-device side) d own so that the sample is substantially horizontal in the horizontal plane, the front side (device side) is up 701.

Align the sample such that the front edge is touching the diamond scribe reference position and the horizontal and x and horizontal y edges of the substrate are against the rail and the base of the sample guide, respectively 703.

Position from left-to-right the sample using the sample guide while the knife is visible along the front edge of the sample, this will be the left, starting point of the target scribe line 705.

Next, determine the target end point where the scribe line is to stop (right end of the scribe line) 707. This second point is controlled by the scribe stop. Thus, slide the scribe stop to the right until the scribe stop is in line with the desired end of the length of the scribe and, using the locking screw, fix the scribe stop in place. This movement is in the y-axis of the horizontal plane.

Next, using the rail, slide the sample towards the front of the table, using the incremental scale lines, to position the sample frontwards so that the diamond tip 709, which protrudes above the plane of the top surface 22 of the table (the knife is stationary relative to the x-axis and y-axis)— that is, slide the rail (thus moving the sample) until the target is in line with the tip of the diamond knife. Positioning can be done by eye (1×) or aided by a magnifier, long working distance microscope (100 mm WD) or stereoscope with up to 100×. A second aligning reference line can be used to align the target in a similar fashion as used to align the scribe, above.

With the knife and sample arranged relative to a desired starting point for the scribe in the x and y directions, by using features on the top of the sample, a gentle downward pressure on the sample will cause the under-mounted upward extending, and protruding diamond knife to impress into the underside of the sample. Now, push the sample guide to the left, this pushes the sample to the left. The sample guide is pushed to the left until it contacts the scribe stop, which stops the sample 711. The diamond scribe is stationary in both the x and y directions, the relative movement, pushing the sample to the left, provides a straight, orthogonal scribe along the y-axis).

An included ruler can be used to determine the size of the sample. In one embodiment the scale is in 5-mm increments with 1-m sub-increments.

If using magnification a cross line or cross-hair can be useful to help align the feature of interest relative to the scribe line and guide rail.

If a short scribe (about 2-mm is desired (as might be used for crystalline samples) slide the scribe stop in the direction of the first reference line. The gap between the edge of the scribe stop and the guide determine the length of the scribe.

Push the sample guide 103 in the direction of the second reference line, putting gentle pressure on the top surface of the sample until it snuggly rests against the scribe stop or the scribe extends across the entire sample. The scribe mark has been made on the backside of the sample.

Cleave the sample 713 using a secondary apparatus. One such exemplary apparatus is described in pending U.S. patent application Device and Method for Cleaving publication number US20130119106 published on May 21, 2016, the contents of which are incorporated herein by reference.

Those skilled in the art will realize that the process sequences described above may be equivalently performed in any order to achieve a desired result. Also, sub-processes may typically be omitted as desired without taking away from the overall functionality of the processes described above.

The invention claimed is:

1. A device configured to scribe a bottom side or surface of a sample or substrate while the substrate is oriented with a top side facing up comprising:
    a substantially flat and planar table surface configured to receive the substrate, the table surface defining a horizontal plane having an x-axis and a y-axis orthogonal to the x-axis and the x-axis and y-axis lie in the horizontal plane, and further including a plurality of scale lines arranged parallel to y-axis;
    a scribe having a tip, the scribe mounted below the horizontal plane, the scribe further disposed to present at least a portion of the tip above the horizontal plane, the scribe further configured to adjust in angle relative to the horizontal plane and a height above the horizontal plane, or to retract below the horizontal plane;
    a rail configured in relation to the horizontal plane so that the rail arranges parallel to the y-axis and movable in a direction parallel to the x-axis whereby the sample can he moved relative to the x-axis in corresponding motion with the rail;
    a sample guide configured in relation to the horizontal plane so that the sample guide arranges parallel to the x-axis and movable in a direction parallel to the y-axis; and
    a scribe stop guide configured in relation to the horizontal plane so that the sample guide arranges parallel to the x-axis and movable in a direction perpendicular to the y-axis, whereby the sample guide moves independent of the scribe stop, the scribe stop further including a locking mechanism to selectively fix the scribe stop at least a first position relative to the y-axis.

2. The device configured to scribe a bottom side or surface of a sample or substrate while the substrate is oriented with a top side facing up of claim 1 further including a hold down coupled to the sample guide.

3. The device configured to scribe a bottom side or surface of a sample or substrate while the substrate is oriented with a top side facing up of claim 1 in which the rail is coupled to the table by a slide.

4. The device configured to scribe a bottom side or surface of a sample or substrate while the substrate is oriented with a top side facing up of claim 1 in which the rail is locked by at least one set screw.

5. The device configured to scribe a bottom side or surface of a sample or substrate while the substrate is oriented with a top side facing up of claim 1 in which the sample guide is orthogonally and slidably coupled to the rail.

6. The device configured to scribe a bottom side or surface of a sample or substrate while the substrate is oriented with a top side facing up of claim 1 in which the scribe further comprises an adjustment lock.

7. A device comprising:
    a rectangular table having a first set of parallel sides, and a second set of parallel sides, perpendicular to the first set of parallel sides and including an integral housing body;
    a sample guide assembly parallel coupled to the first set of parallel sides so that the sample guide moves across the rectangular table and maintains a parallel orientation to the first set of parallel sides;
    a scribe guide slidably coupled at a right angle to the sample guide assembly, and parallel to the second set of parallel sides; and
    an adjustable scribe disposed in the rectangular table.

8. The device of claim 7 further comprising a scribe stop slidably coupled to the scribe guide assembly.

9. The device of claim 7 in which the scribe is adjustable.

10. The device of claim 9 in which the scribe height is adjusted by tilting the adjustable cartridge assembly.

11. The device of claim 9 in which adjustment is performed by a knob adjustment.

12. The device of claim 7 further comprising a hold down magnetically coupled to the sample guide.

13. The device of claim 7 further comprising an adapter for aligning a substantially circular work piece on the rectangular table.

14. The device of claim 13 in which the adapter includes a ferromagnetic ring.

15. The device of claim 7 in which the adjustable scribe is held in place by a scribe carriage lock.

16. The device or claim 7 in which the adjustable scribe extends through an aperture in the rectangular table.

17. The device of claim 7 in which the adjustable scribe includes a diamond tip.

18. The device of claim 7 in which the adjustable scribe includes:
a diamond tipped scribe; and
an adjustable cartridge assembly threadably coupled to the diamond tipped scribe for adjusting a scribe height.

19. The device of claim 7 in which the rectangular table includes a plurality of feet on a bottom side.

20. A method for scribing a bottom side or surface of a sample or substrate while the substrate is oriented with a top side facing up comprising:
placing a sample on a table;
determining a first position for a scribe start by viewing the top side of the substrate;
adjusting a sample guide and thereby pushing the sample to the first position;
determining a second position for a scribe stop by viewing the top side of the substrate;
adjusting a scribe stop guide to the second position by viewing the top side of the substrate;
locking the scribe stop at the second position;
pushing down on the sample; and
pushing the sample guide toward the second position.

* * * * *